United States Patent
Wang et al.

(10) Patent No.: US 9,832,887 B2
(45) Date of Patent: Nov. 28, 2017

(54) MICRO MECHANICAL ANCHOR FOR 3D ARCHITECTURE

(71) Applicant: Invensas Corporation, San Jose, CA (US)

(72) Inventors: Liang Wang, Milpitas, CA (US); Ilyas Mohammed, Santa Clara, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 365 days.

(21) Appl. No.: 13/961,217

(22) Filed: Aug. 7, 2013

(65) Prior Publication Data

US 2015/0041208 A1    Feb. 12, 2015

(51) Int. Cl.
| | | |
|---|---|---|
| H05K 3/40 | (2006.01) | |
| H05K 3/42 | (2006.01) | |
| H01L 21/48 | (2006.01) | |
| H01L 23/498 | (2006.01) | |
| H05K 1/02 | (2006.01) | |
| H05K 1/11 | (2006.01) | |

(52) U.S. Cl.
CPC .............. *H05K 3/42* (2013.01); *H01L 21/486* (2013.01); *H01L 23/49811* (2013.01); *H01L 23/49827* (2013.01); *H05K 1/0296* (2013.01); *H05K 1/11* (2013.01); *H01L 2224/16225* (2013.01); *Y10T 29/49204* (2015.01)

(58) Field of Classification Search
CPC .......... H05K 2201/2072; H05K 3/4007; Y10T 29/49204; Y10T 29/49222
USPC ................... 29/874, 884, 876, 825, 829, 846
See application file for complete search history.

(56) References Cited

U.S. PATENT DOCUMENTS

| | | | | | |
|---|---|---|---|---|---|
| 4,442,938 A | * | 4/1984 | Murphy | ............. | B65D 73/0042 |
| | | | | | 206/347 |
| 4,813,129 A | * | 3/1989 | Karnezos | ........... | H01R 13/2464 |
| | | | | | 257/E23.021 |
| 5,071,363 A | * | 12/1991 | Reylek | ..................... | H01R 4/26 |
| | | | | | 439/290 |

(Continued)

OTHER PUBLICATIONS

International Search Report and Written Opinion for Application No. PCT/US2014/050124 dated Nov. 18, 2014.

*Primary Examiner* — Peter DungBa Vo
*Assistant Examiner* — Kaying Kue
(74) *Attorney, Agent, or Firm* — Lerner, David, Littenberg, Krumholz & Mentlik, LLP

(57) ABSTRACT

Components and methods of making the same are disclosed herein. In one embodiment, a method of forming a component comprises forming metal anchoring elements at a first surface of a support element having first and second oppositely facing surfaces, the support element having a thickness extending in a first direction between the first and second surfaces, wherein each anchoring element has a downwardly facing overhang surface; and then forming posts having first ends proximate the first surface and second ends disposed above the respective first ends and above the first surface, wherein a laterally extending portion of each post contacts at least a first area of the overhang surface of the respective anchoring element and extends downwardly therefrom, and the overhang surface of the anchoring element resists axial and shear forces applied to the posts at positions above the anchoring elements.

15 Claims, 12 Drawing Sheets

(56) References Cited

U.S. PATENT DOCUMENTS

| | | | | |
|---|---|---|---|---|
| 5,169,680 A | * | 12/1992 | Ting | H01L 21/288 257/E21.174 |
| 5,279,028 A | * | 1/1994 | McKee | B23K 3/0475 219/549 |
| 5,342,207 A | * | 8/1994 | Sobhani | H05K 3/365 29/846 |
| 5,525,065 A | * | 6/1996 | Sobhani | H01R 12/52 29/831 |
| 5,619,071 A | * | 4/1997 | Myers | H01L 21/32133 257/753 |
| 5,632,631 A | * | 5/1997 | Fjelstad | G01R 1/0466 257/E23.067 |
| 5,716,663 A | * | 2/1998 | Capote | B23K 35/0222 156/277 |
| 5,850,693 A | * | 12/1998 | Guran | H01R 43/205 29/845 |
| 6,020,561 A | * | 2/2000 | Ishida | H01L 21/4853 174/261 |
| 6,051,890 A | | 4/2000 | Mozdzen | |
| 6,169,010 B1 | * | 1/2001 | Higashi | H01L 21/76805 257/306 |
| 6,321,654 B1 | * | 11/2001 | Robinson | F42C 15/24 102/251 |
| 6,442,831 B1 | * | 9/2002 | Khandros | H05K 3/4015 228/188 |
| 6,908,311 B2 | * | 6/2005 | Ono | H01L 24/11 257/E21.508 |
| 7,026,721 B2 | * | 4/2006 | Chen | H01L 24/03 257/459 |
| 7,190,078 B2 | * | 3/2007 | Khandekar | H01L 21/486 257/621 |
| 7,213,329 B2 | * | 5/2007 | Kim | H01L 21/4853 257/E23.069 |
| 7,517,736 B2 | * | 4/2009 | Mehta | H01L 21/76802 257/E21.575 |
| 7,579,857 B2 | * | 8/2009 | Chen | G01R 1/06727 216/11 |
| 7,607,223 B2 | * | 10/2009 | Pleskach | F16L 25/01 29/831 |
| 7,622,391 B2 | * | 11/2009 | Frohberg | H01L 21/76804 257/E21.485 |
| 8,141,247 B2 | * | 3/2012 | Pendse | H01L 23/3128 257/777 |
| 8,309,856 B2 | * | 11/2012 | Kuroda | H05K 3/244 174/257 |
| 8,314,026 B2 | * | 11/2012 | Uehling | H01L 23/5226 438/637 |
| 8,984,748 B2 | * | 3/2015 | Rathburn | G01R 1/0491 29/830 |
| 2002/0086517 A1 | | 7/2002 | Barth et al. | |
| 2005/0081376 A1 | | 4/2005 | Sir et al. | |
| 2005/0121803 A1 | * | 6/2005 | Angell | H01L 24/03 257/779 |
| 2006/0112550 A1 | * | 6/2006 | Kim | G01R 3/00 29/884 |
| 2006/0141762 A1 | | 6/2006 | Khandekar et al. | |
| 2007/0045874 A1 | * | 3/2007 | Eldridge | H01L 23/4822 257/784 |
| 2007/0097154 A1 | * | 5/2007 | Kojima | B41J 2/14233 347/1 |
| 2008/0265427 A1 | * | 10/2008 | Hirler | H01L 29/7811 257/773 |
| 2009/0066352 A1 | * | 3/2009 | Gritters | B82Y 10/00 324/755.05 |
| 2009/0119916 A1 | * | 5/2009 | Hougham | H05K 3/326 29/884 |
| 2009/0194885 A1 | | 8/2009 | Jobetto | |
| 2010/0001399 A1 | | 1/2010 | Topacio | |
| 2012/0139124 A1 | | 6/2012 | Oganesian et al. | |
| 2013/0026645 A1 | | 1/2013 | Mohammed et al. | |
| 2013/0105984 A1 | * | 5/2013 | Rathburn | H01R 12/7076 257/773 |

* cited by examiner

MICRO MECHANICAL ANCHOR FOR 3D ARCHITECTURE

FIELD OF THE INVENTION

The present application describes structures such as that which can be incorporated into a microelectronic assembly which may include an unpackaged semiconductor die or packaged semiconductor die, as well as methods for making such structures.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically between about 0.005 mm and about 0.8 mm in diameter, attached to the terminals of the package. A package having an array of solder balls projecting from its bottom surface is commonly referred to as a ball grid array or "BGA" package. Other packages, referred to as land grid array or "LGA" packages have thin layers or lands, which fit into a socket or are secured to the substrate by solder. Packages of this type can be quite compact. Certain packages, commonly referred to as "chip scale packages," occupy an area of the circuit panel equal to, or only slightly larger than, the area of the device incorporated in the package. This is advantageous in that it reduces the overall size of the assembly and permits the use of short interconnections between various devices on the circuit panel, which in turn limits signal propagation time between devices and thus facilitates operation of the assembly at high speeds.

An interposer can be provided as an interconnection element having contacts and top and bottom surfaces thereof electrically connected with one or more packaged or unpackaged semiconductor dies at one of the top or bottom surface thereof, and electrically connected with another component at the other one of the top or bottom surfaces. The other component may in some cases be a package substrate which in turn may be electrically connected with another component which may be or may include a circuit panel.

Despite all of the above-described advances in the art, still further improvements in microelectronics assemblies, the individual components thereof, such as interposers and microelectronics elements, and methods of making the same would be desirable.

BRIEF SUMMARY OF THE INVENTION

Components and methods of making the same are disclosed herein. In one embodiment, a method of forming a component comprises forming metal anchoring elements at a first surface of a support element having first and second oppositely facing surfaces. The support element can have a thickness extending in a first direction between the first and second surfaces. Each anchoring element can have a downwardly facing overhang surface. The method includes then forming posts having first ends proximate the first surface and second ends disposed above the respective first ends and above the first surface. A laterally extending portion of each post contacts at least a first area of the overhang surface of the respective anchoring element and extends downwardly therefrom. The overhang surface of the anchoring element resists axial and shear forces applied to the posts at positions above the anchoring elements.

In one embodiment, the anchoring elements further comprise metal elements that are supported by structures extending towards the second surface, each metal element having an upper surface facing away from the first surface and a lower surface remote from the upper surface, wherein a portion of the lower surface, which extends beyond the structure, defines the overhang surface.

In one embodiment, the structure is associated with at least a portion of the support element.

In one embodiment, the posts extend more than 50 micrometers above the metal elements.

In one embodiment, the posts extend between 50 and 500 micrometers above the metal elements.

In one embodiment, the posts have heights and widths, the heights being 1.5 times the respective widths.

In one embodiment, the posts include polymer elements having electrically conductive coatings at exterior surfaces thereof.

In one embodiment, forming the posts further comprises injecting polymer materials into a molding overlying the anchoring elements to form the posts.

In one embodiment, the metal element defines an opening and the structure at least partially defines a cavity aligned with the opening, and the overhang surface extends beyond a wall of the cavity.

In one embodiment, the overhang surface extends beyond a periphery of the structure.

In one embodiment, forming the anchoring elements further comprises forming the metal elements overlying the structure; and undercutting material of the structures to form the overhang surfaces of the metal elements.

In one embodiment, forming the anchoring elements further comprises patterning openings in the metal elements, wherein the undercutting of the material of the structures is formed by processing applied through the openings.

In one embodiment, patterning openings in the metal elements further comprises forming photoresist layers overlying portions of upper surfaces of the structures; forming the metal elements overlying remaining portions of the upper surfaces of the structures; and removing the photoresist layers to expose the openings in the metal elements.

In one embodiment, a method of forming a component comprises forming metal anchoring elements at a first surface of a support element having first and second oppositely facing surfaces. The support element can have a thickness extending in a first direction between the first and second surfaces. Each anchoring element can have one or more recesses extending towards the second surface of the support element. The method includes then forming posts having first ends proximate the first surface and second ends disposed above the respective first ends and above the first surface. An axially extending portion of each post contacts at least a portion of the one or more cavities of the respective anchoring element and extends downwardly therefrom. The one or more cavities of the anchoring element resists axial and shear forces applied to the posts at positions above the anchoring elements.

In one embodiment, a component comprises a support element having first and second oppositely facing surfaces and having a thickness extending in a first direction between the first and second surfaces, metal anchoring elements at the first surface, each anchoring element having an overhang surface extending in a direction along the first surface, the overhang surface facing toward the second surface; and posts having first ends proximate the first surface and second ends disposed above the respective first ends and above the first surface, wherein a laterally extending portion of each post contacts at least a first area of the overhang surface of the respective anchoring element and extends downwardly therefrom, and the overhang surface of the anchoring element resists axial and shear forces applied to the post above the anchoring elements.

In one embodiment, at least some anchoring elements further comprise metal elements that are supported by structure extending towards the second surface, each metal element having an upper surface facing away from the first surface and a lower surface remote from the upper surface, wherein a portion of the lower surface, which extends beyond the structure, defines the overhang surface.

In one embodiment, the metal element defines an opening and the structure at least partially defines a cavity aligned with the opening, and the overhang surface extends beyond a wall of the cavity.

In one embodiment, the structure further comprises a second metal element overlying the first surface of the support structure, wherein the second metal element at least partially defines the cavity.

In one embodiment, the overhang surface extends beyond a periphery of the structure.

In one embodiment, the component further includes electrically conductive interconnects supported by the support element and extending in the first direction for electrically coupling conductive elements at the respective first and second surfaces, wherein the conductive posts contact at least some of the conductive interconnects.

In one embodiment, the posts extend more than 50 micrometers above the metal elements.

In one embodiment, the posts extend between 50 and 500 micrometers above the metal elements.

In one embodiment, the posts have heights and widths, the heights being at least about 1.5 times the respective widths.

In one embodiment, the posts include polymer elements having electrically conductive coatings at exterior surfaces thereof.

BRIEF DESCRIPTION OF THE DRAWINGS

FIG. 1-2 depicts a side schematic view of an anchoring element in accordance with some embodiments of the invention.

FIG. 1-3 depicts a side schematic view of an anchoring element in accordance with some embodiments of the invention.

FIG. 1-4 depicts a side schematic view of an anchoring element in accordance with some embodiments of the invention.

FIG. 1-5 depicts a top down schematic view of the anchoring element of FIG. 1-4 in accordance with some embodiments of the invention.

FIG. 1-6 depicts a top down schematic view of a component in accordance with some embodiments of the invention.

FIG. 1-7 depicts a side schematic view of a microelectronic assembly in accordance with some embodiments of the invention.

FIG. 2 depicts a flow chart for a method of forming a component in accordance with some embodiments of the present invention.

FIGS. 3-1 through 3-6 depict stages in a method of fabricating a component in accordance with some embodiments of the invention.

FIGS. 4-1 through 4-5 depict stages in a method of fabricating a component in accordance with some embodiments of the invention.

FIGS. 5-1 through 5-2 depict stages in a method of fabricating a component in accordance with some embodiments of the invention.

FIGS. 6-1 through 6-5 depict stages in a method of fabricating a component in accordance with some embodiments of the invention.

FIGS. 7-1 through 7-3 stages in a method of fabricating a component in accordance with some embodiments of the invention.

DETAILED DESCRIPTION

Embodiments in accordance with the present invention will be described in more detail below.

All ranges recited herein include the endpoints, including those that recite a range "between" two values. Terms such as "about," "generally," "substantially," and the like are to be construed as modifying a term or value such that it is not an absolute, but does not read on the prior art. Such terms will be defined by the circumstances and the terms that they modify as those terms are understood by those of skill in the art. This includes, at very least, the degree of expected experimental error, technique error and instrument error for a given technique used to measure a value.

It should be further understood that a description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.3, 3, 4, 5, 5.7 and 6. This applies regardless of the breadth of the range.

As used in this disclosure with reference to a component, a statement that an element, e.g., a conductive element, contact, metal post, terminal, structure, or other element, is "at" a surface of a component, e.g., microelectronic element, interposer, circuit panel, or other substrate, indicates that, when the component is not assembled with any other element, the element is available for contact with a theoretical point moving in a direction perpendicular to the surface of the component toward the surface of the component from outside the component. Thus, an element which is at a surface of a component may project from such surface; may be flush with such surface; or may be recessed relative to such surface in a hole or depression in the component.

FIGS. 1-1 through 1-5 depict components in accordance with some embodiments of the invention. The various embodiments of the components disclosed herein may be utilized alone, or combination. The components described in accordance with the invention can advantageously facilitate a more robust structure supported by anchoring elements. The anchoring elements can further facilitate improved fabrication of the components in some aspects.

Figure 1:
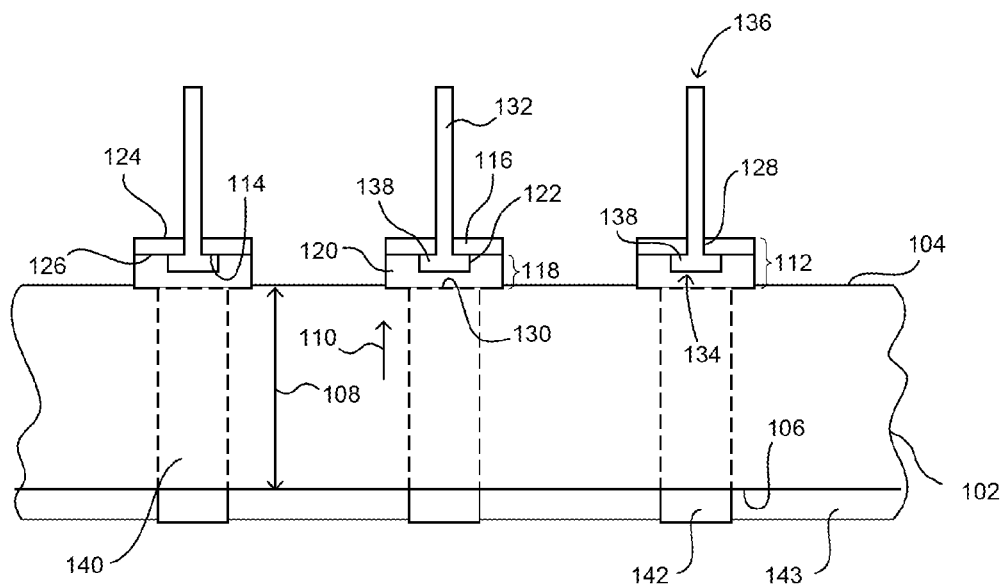
FIG. 1-1 depicts a side schematic view of a component in accordance with some embodiments of the invention.

FIG. 1-1 depicts a side schematic view of a component 100 in accordance with some embodiments of the invention. The component 100 includes a support element 102 having a first surface 104 and a second oppositely facing surface 106. The support element 102 has a thickness 108 extending in a first direction 110 between the first and second surfaces 104, 106. The support element 102 can consist essentially of one or more of a dielectric material, semiconductor material, or electrically conductive material. In one embodiment, the support element 102 consists essentially of a dielectric material.

The component 100 includes a metal anchoring element 112 at the first surface 104 of the support element 102. In some aspects of the present invention, the anchoring element 112 has an overhang surface 114 extending in a direction along the first surface 104 of the support element 102. The overhang surface 114 faces toward the second surface 106 of the support element.

FIG. 1-1 depicts the anchoring element 112 according to one aspect of the present invention. The anchoring element includes a metal element 116 that is supported by a structure 118 extending towards the second surface 106 of the support element 102. In one example, the structure 118 includes a second metal element 120 overlying the first surface 104 of the support structure 102. The second metal element 120 can have a thickness extending in the first direction 110 from a lower surface 119, which is adjacent to the first surface 104 of the support element 102, to an upper surface 121. The second metal element 120 at least partially defines a cavity 122 of the anchoring element 112.

The metal element 116 includes an upper surface 124 facing away from the first surface 104 of the support element 104 and an oppositely facing lower surface 126. The lower surface 126 of the metal element defines the overhang surface 114. The overhang surface 114 is defined by an area of the lower surface 126 of the metal element 116 that extends beyond the structure. In one example, the metal element 116 overlies the second metal element 120 as depicted in FIG. 1-1. The metal element 116 defines an opening 128. The opening 128 can be aligned with the cavity 122, where the overhang surface 114 is defined as an area of the lower surface 126 of the metal element 116 that extends beyond a wall of the cavity 122. The overhang surface 114 overlies and confronts a bottom surface 130 of the cavity 122. In one exemplary embodiment depicted in FIG. 1-1, the cavity 122 has a rectangular cross section having vertical and horizontal surfaces. The cavity 122 can have any suitable cross section, such as having curved surfaces or the like. In one aspect, the cross section of the cavity 122 can be a cross section resultant from isotropic or anisotropic etching.

The component 100 includes posts 132 having first ends 134 proximate the first surface 104 of the support element 102 and second ends 136 disposed above the respective first ends 134 and above the first surface 104. The posts 132 include a laterally extending portion 138 that contacts a first area of the overhang surface 114 of a respective anchoring element 112 and extends downwardly therefrom. In one example, the laterally extending portion 138 extends downward into the cavity 122 as depicted in FIG. 1-1 and contacts the bottom surface 130 of the cavity 122. Though illustrated as contacting the entirety of the overhang surface 114, and the walls and bottom surface 130 of the cavity 122, the laterally extending portion 138 may contact these surfaces only partially or not at all in some embodiments. The first end 134 and laterally extending portion 138 of the posts 132 can have any suitable shape, include those shapes that conform to the shape of the cavity 122.

The overhang surface 114 and the anchoring elements 112 can resist axial and shear forces applied to the posts 132 above the anchoring elements 112. In one example, when the laterally extending portion 138 of a respective post 132 contacts the bottom surface 130 of the cavity 122, the bottom surface 130 can resist axial and shear forces applied to the posts 132 above the anchoring elements 112.

The posts 132 can include electrically conducting materials. For example, the posts may be plated metal structures, polymer elements having electrically conductive coatings, solder posts, or metal posts comprising any suitable metal and formed by any suitable means. The posts 132 can extend more than about 50 microns above the metal elements 116 of the anchoring elements 112. In one embodiment, the posts 132 can extend between about 50 microns to about 500 microns above the metal elements 116. The posts 132 can have an aspect ratio, wherein the height of a respective post is about twice its width. In one embodiment, the height of a respective post may be about 2.5 to about 3 times its width. The pitch of the posts 132 can be less than the height of the posts 132. In one example, the pitch in one or more directions parallel to the first surface 104 can be less than about 400 microns.

The component 100 can, optionally, include electrically conductive interconnects 140. The interconnects 140 can be supported by the support element 102 and extending in the first direction 110 for electrically coupling conductive elements at, or adjacent to, the first and second surfaces 104, 106 of the support element 102. In one example, the posts 132 can be electrically coupled to at least some of the interconnects 140 at the first surface 104. For example, as depicted in FIG. 1-1, the posts 132 can be electrically coupled to the interconnects 140 through the anchoring elements 112. The anchoring elements 112 need not be directly coupled to and/or aligned with the interconnects 140 as depicted in FIG. 1-1. For example, the anchoring elements 112 may be coupled to the interconnects 140 by a trace that extends along the surface 104 and/or one or more of the interconnects may be omitted entirely. As disclosed herein, embodiments of any anchoring element can be optionally coupled to an interconnect 140 in any suitable configuration.

The component 100 can include terminals at the first and second surfaces 104, 106 of the support structure 102. The terminals can be used to connect the component 100 to other components of a microelectronic assembly. The terminals can be part of a redistribution structure, pin array, or the surfaces of the interconnects 140. In one example, at least some of the terminals at the first surface 104 are the posts 132. In one example, terminals 142 coupled to the interconnects 140 at the second surface 106 of the support element 102 are part of a redistribution structure 143. The terminals 142 can contact the interconnects 140, or be electrically coupled with the interconnects 140 through a trace 144 as depicted in top down view of the component 100 in FIG. 1-6.

The component 100 can be a component of a microelectronic assembly. Exemplary components 100 can include an interposer, a package substrate, a microelectronic element, a printed circuit board (PCB), other components, or any electronic substrate. FIG. 1-7 depicts an exploded view of one exemplary microelectronic assembly 160, where the component 100 is part of a vertically stacked structure. The component 100 can be electrically coupled to other components in a vertical arrangement by the posts 132 at a first side of the component 100 and by the terminals 142 at an opposing second side of the component 100, respectively. For example, one or more first components 162, such as microelectronic element, can be stacked adjacent to the second side of the component 100 and overlying the component 100, and the component 100 in turn can be stacked at the first side thereof to overlie a circuit panel 164, or another component, such as an interposer. In one example, the posts 132 may be inserted into corresponding sockets at a surface of the circuit panel 164. Many vertical stacking arrangements and components are possible, and not limited to the exemplary embodiment depicted in FIG. 1-7.

Figures 1, 2:
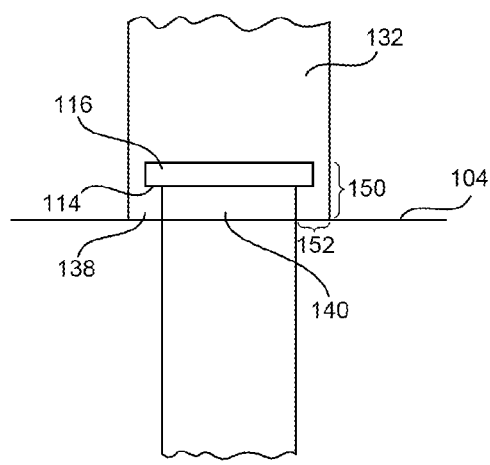

FIG. 1-2 depicts a side schematic view of an anchoring element 150 in accordance with some embodiments of the invention. The anchoring element 150 can include any embodiments and/or permutations as described for the anchoring element 112, except where otherwise noted. In one embodiment of the invention, as shown for the anchoring element 150, the overhang surface 114 extends beyond the periphery of the second metal element 120. Further, the cavity 122 is absent from the anchoring element 150. The overhang surface 114 overlies and confronts an area 152 of the first surface 104, where the area 152 extends beyond the periphery of the second metal element 120. The laterally extending portion 138 of a respective post 132 extends laterally inward towards the periphery of the second metal element 120 as depicted in FIG. 1-2. The laterally extending portion 138 contacts at least a first area of the overhang surface 114 and extends downward therefrom towards the first surface 104. In one example, the laterally extending portion 138 contacts the area 152 of the first surface 104. The area 152 can resist axial and shear forces applied to the post 114 above the anchoring element 150. Though depicted as contacting the entirety of the overhang surface 114, periphery of the second metal element 120 and area 152, the laterally extending portion 138 may contact these surfaces only partially or not at all in some embodiments.

Figures 1, 2, 3:
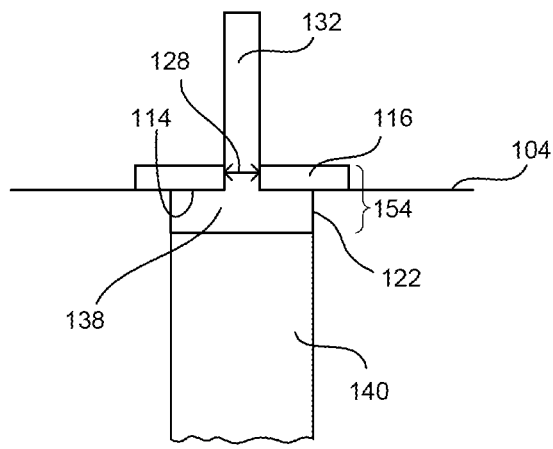

FIG. 1-3 depicts a side schematic view of an anchoring element 154 in accordance with some embodiments of the invention. The anchoring element 154 can include any embodiments and/or permutations as described for the anchoring element 112, except where otherwise noted. In one embodiment of the invention, as shown for the anchoring element 154, the anchoring element 154 includes the metal element 116 but not the second metal element 120. As depicted in FIG. 1-3, the cavity 112 of the anchoring element 154 is formed in the first surface 104 of the support element 102 and extends towards the second surface 106. The metal element 116 overlies the first surface 104 of the support element 102 and the overhang surface 114 extends inwardly beyond the walls of the cavity 122. The metal element 116 defines the opening 128 and the cavity 122 is aligned with the opening 128.

FIG. 1-4 through 1-5 depict side and top down schematic views, respectively, of an anchoring element 156 in accordance with some embodiments of the invention. The anchoring element 156 can include any embodiments and/or permutations as described for the anchoring element 112, except where otherwise noted. In one embodiment, as shown for the anchoring element 156, the anchoring element 156 includes the second metal element 120 and not the metal element 116. The second metal element 120 includes one or more cavities 158 formed therein. The one or more cavities 158 can be arranged in any arrangement suitable for the anchoring element 156 to resist axial and shear forces applied to a respective post 114. One exemplary arrangement of the one or more cavities 158 is depicted in top down view in FIG. 1-5. The one or more cavities 158 can include any embodiments and/or permutations as described for the cavity 122, except where otherwise noted. In one embodiment, the post 132 includes one or more axial extending portions 159, where the one or more axially extending portions 159 contact at least a portion of the one or more cavities 158 and extend downwardly therefrom. The one or more cavities 158 resist axial and shear forces applied to the post 114 at positions above the anchoring element 158.

FIG. 2 depicts a flow chart of a method 200 for fabrication of the component 100 in accordance with some embodiments of the present invention. The method 200 is described below in accordance with the stages of fabrication of the component 100 having anchoring element 112 depicted in FIGS. 3-1 through 3-6, and FIGS. 4-1 through 4-5, having anchoring element 150 depicted in FIGS. 5-1 through 5-2, and having anchoring element 154 depicted in FIGS. 6-1 through 6-6. However, the method 200 may be applied to other embodiments of the present invention, or other components within the scope of the invention.

FIG. 3-1 depicts stages in a method of fabricating the anchoring element 112 in accordance with some embodiments of the invention. At 202, the anchoring element 112 is formed at the first surface 104 of the support element 102. As depicted in FIG. 3-1, the component 100 includes the second metal element 120 overlying the first surface 104 of the support element 102. In one aspect, the conductive interconnect 140 may be formed in the support element 102 prior to formation of the anchoring element 112. The second metal element 120 can be deposited at the first surface 104 by any suitable process. The second metal element 120 can be formed by any suitable method. In one aspect, the second metal element 120 can be formed by plating a metal layer overlying the surface 104, and then etching the plated metal layer to form the second metal element 120. In another aspect, a patterned layer may be formed overlying the first surface 104, and then the second metal elements 120 may be formed in the patterned layer by plating or another deposition process.

Figures 1, 2, 3, 4:
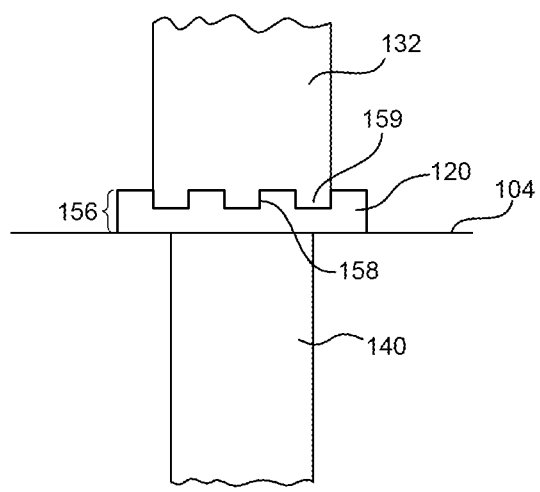

FIG. 3-2 depicts a photoresist layer 302 formed overlying a portion of the upper surface 121 of the second metal element 120. The photoresist layer 302 does not contact at least some of the edges of the upper surface 121. In some aspects, the photoresist layer 302 may overlie the peripheral walls of the second metal element 120. The metal layer 116 is formed overlying the remaining portions of the upper surface 121 of the second metal element 120 as depicted in FIG. 3-3. The photoresist layer 302 is removed to expose the opening 128 in the metal element 116 as depicted in FIG. 3-4. Material of the second metal element 120 is undercut to form the overhang surface 114 and the cavity 122. In one aspect, the materials of the metal elements 116, 120 are different. In one example, the metal element 116 includes nickel (Ni) and the second metal element 120 includes copper (Cu). Copper can be selectively etched relative to nickel to form the cavity 122 and the overhang surface 114. Other exemplary materials that may be used for the metal elements 116, 120, respectively, include gold and copper, tin and copper, chrome and copper, nickel and gold, solder mask and copper, or dielectric material and copper.

In one aspect, when the photoresist 302 does not overlie the walls of the second metal element 120, the walls of the second metal element 120 can be etched to form another overhang surface, similar to that in the anchoring element 150. The additional overhang surface may also be contacted by a lateral extending portion of the post 132, and may resist axial and shear forces applied to the post 132 above the anchoring element 112.

At 202, the posts 132 are formed in a manner anchored by the anchoring element 112. The posts 132 may be formed in corresponding openings 306 of a mold 304 overlying anchoring elements 112 as depicted in FIG. 3-6. In one aspect, the post 132 may be formed by plating one or more metals into the opening 306 of the mold 304. In another aspect, the post 132 may be formed by injecting a polymer material into the opening 306 in the mold 304. The anchoring elements 112 may advantageously secure the posts 132, once formed, against axial and shear forces caused by the removal of the mold. One or more plating or metal or metal-containing coatings may be applied to surfaces of the posts 132 after removing the mold, such as, but not limited to, when polymer elements are formed in the mold 304.

Figures 1, 2, 3, 4, 5:
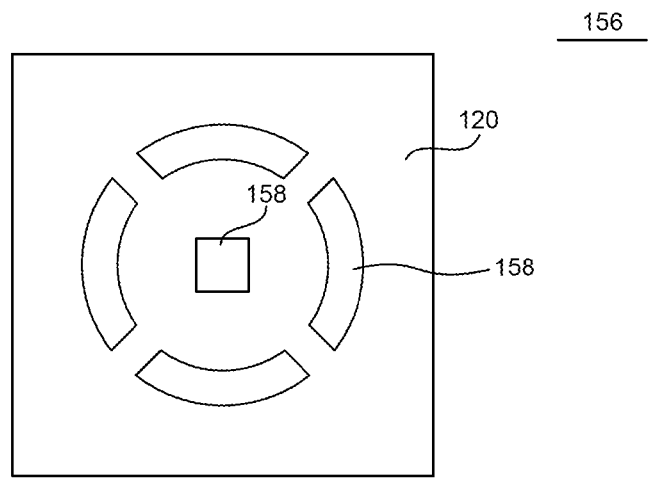

FIGS. 4-1 through 4-5 depict stages in a method of fabricating the anchoring element 110 in accordance with another aspect of the invention. As depicted in FIG. 4-1, the second metal element 120 is deposited overlying the first surface 104 of the support element 102. Then, the metal element 116 is deposited overlying the upper surface 121 of the second metal element 120. FIG. 4-2 depicts a patterned photoresist layer 402 deposited overlying the upper surface 124 of the metal element 116. In one aspect, the photoresist layer 402 may overlie the peripheral walls of the metal elements 116, 120 as depicted in FIG. 4-2. The photoresist layer 402 includes an opening 404 overlying a portion of the upper surface 124 of the metal element 116. FIG. 4-3 depicts material removed from the metal element 116 underlying the opening 404 to form the opening 128 in the metal element 116. Once the opening 128 is formed in the metal element 116, material is removed from processes applied through the opening 128 to form the cavity 122 and overhang surface 114 as depicted in FIG. 4-5. The cavity 122 and overhang surface 114 can be formed by processes discussed above with regards to FIGS. 3-1 through 3-6. The photoresist layer 402 can be removed, and the posts 132 are formed as depicted in FIG. 4-5. Removal of the photoresist layer 402 and formation of the posts 132 can be accomplished by methods discussed above with regards to FIGS. 3-1 through 3-6.

FIGS. 5-1 through 5-2 depict the stages in a method of fabricating the anchoring element 150 in accordance with another aspect of the invention. As depicted in FIG. 5-1, a structure is provided which includes the metal element 116 overlying the second metal element 120, the structure at the first surface 104. For example, the metal element 116 can be deposited on the upper surface 121 of the second metal element 120. As depicted in FIG. 5-2, material is selectively removed from the peripheral walls of the second metal element 120 to form an overhang surface 114 of the metal element 116, where the metal element 116 extends beyond the periphery of the second metal element 120. In one aspect, the materials of the metal elements 116, 120 are different. In one example, the metal element 116 includes nickel (Ni) and the second metal element 120 includes copper (Cu). Copper can be selective etched relative to nickel to form the overhang surface 114 as depicted in FIG. 5-2. The posts 132 can be formed such that the laterally extending portion 128 contacts at least a portion of the overhang surface 114. Formation of the posts 132 can be accomplished by methods discussed above with regards to FIGS. 3-1 through 3-6.

Figures 1, 2, 3, 4, 5, 6:
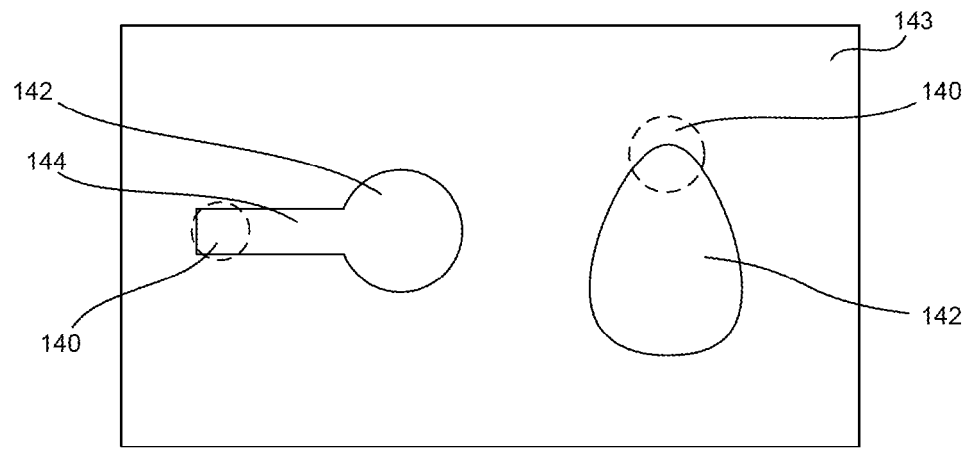

FIGS. 6-1 through 6-5 depict the stages in a method of fabricating the anchoring element 154 in accordance with another aspect of the invention. FIG. 6-1 depicts metal element 116 overlying the first surface 104 of the support element 102. Optionally, the metal element 116 may be overlying the conductive interconnect 140 in embodiments where the conductive interconnect 140 is present.

FIG. 6-2 depicts a patterned photoresist layer 602 overlying the upper surface 124 of the metal element 116. The patterned photoresist layer 602 includes an opening 604 overlying a portion of the upper surface 124 the metal element 116. In one aspect, the portion of the metal element 116 is a non-peripheral edge portion of the upper surface 124. FIG. 6-3 depicts material removed from the metal element 116 underlying the opening 604 to form the opening 128 in the metal element 116. Once the opening 128 is formed in the metal element 116, material is removed from processes applied through the opening 128 to form the cavity 122 in the support element 102 and the overhang surface 114 as depicted in FIG. 6-4. The cavity 122 and overhang surface 114 can be formed by an etching process to remove materials from the support element 102. In one aspect, when the conductive interconnect 140 is present, an etching solution or gas suitable for etching a metal or semiconductor material may be used to etch the cavity 122 at least partially in the conductive interconnect 140. In another aspect, when the conductive interconnect 140 is not present, an etching solution or gas suitable for etching a dielectric material may be used to etch the cavity 122. The posts 132 can be formed, and then the photoresist layer 602 can be removed as depicted in FIG. 6-5. Removal of the photoresist layer 602 and formation of the posts 132 can be accomplished by methods discussed above with regards to FIGS. 3-1 through 3-6.

Figures 1, 2, 3, 4, 5, 6, 7:
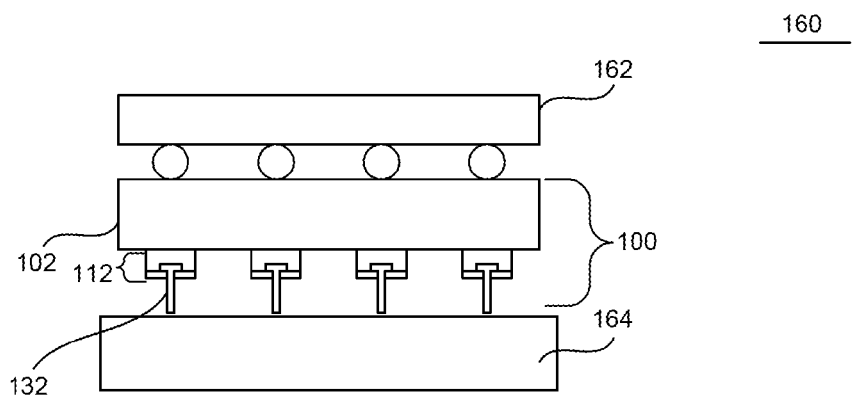
Figure 2:
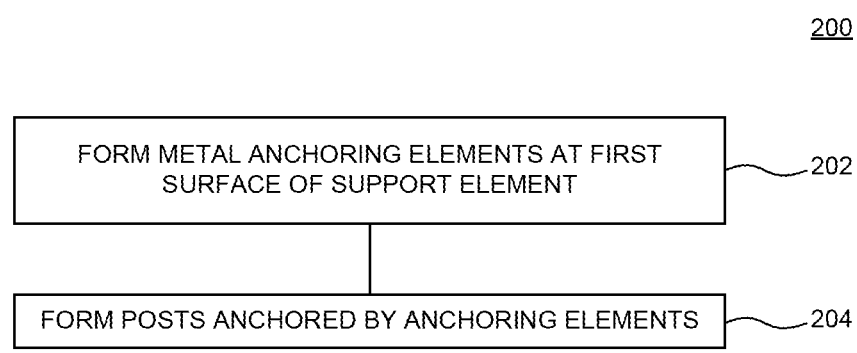
Figures 1, 3:
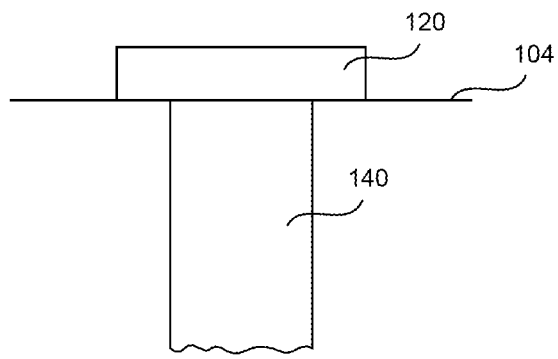
Figures 2, 3:
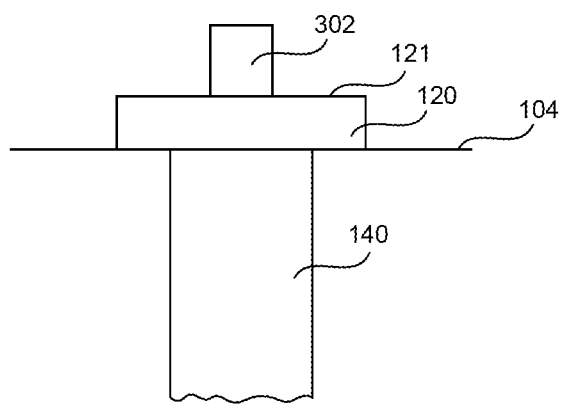
Figure 3:
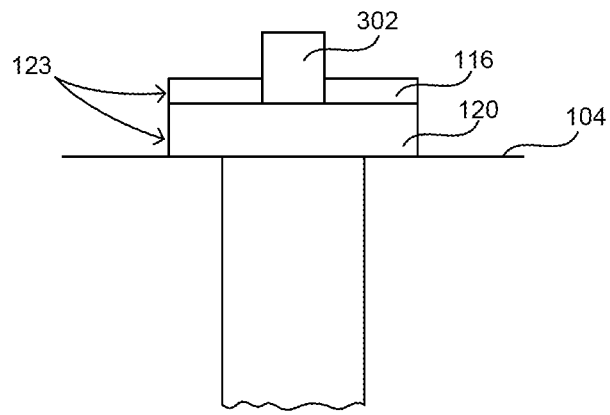
Figures 3, 4:
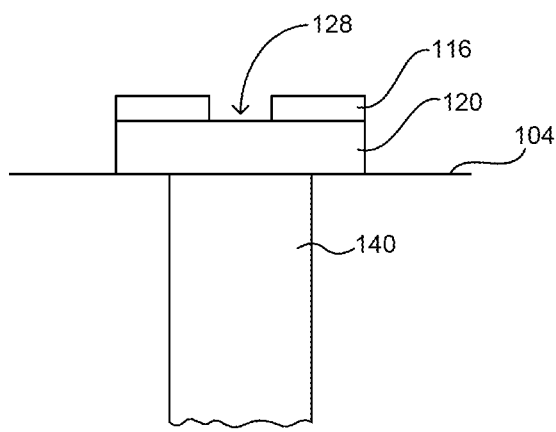
Figures 3, 4, 5:
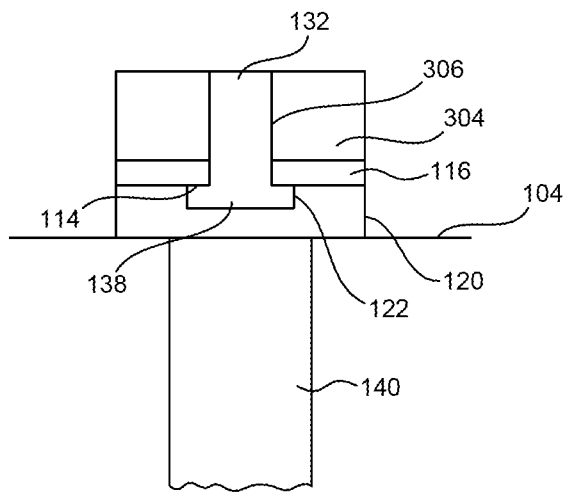
Figures 3, 4, 5, 6:
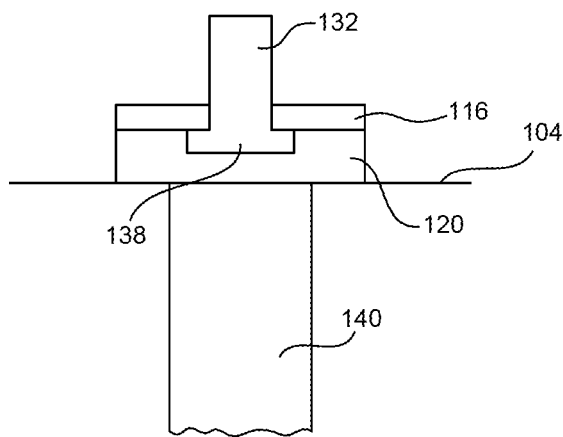
Figures 1, 4:
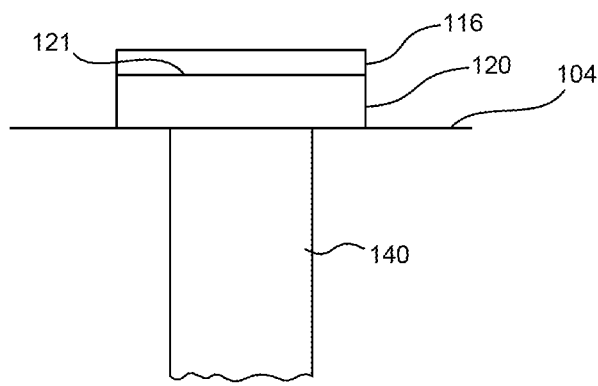
Figures 2, 4:
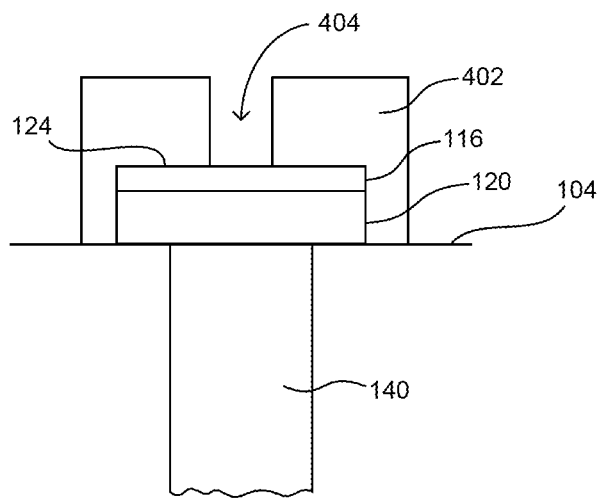
Figures 3, 4:
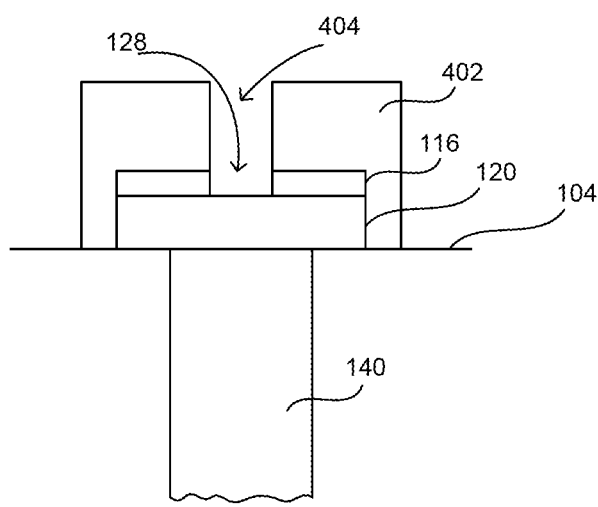
Figure 4:
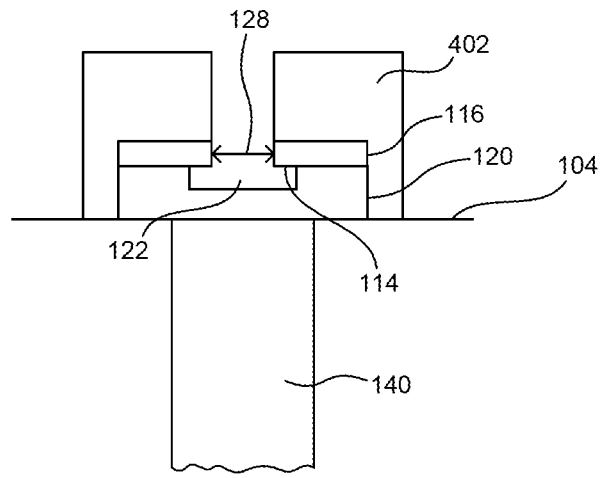
Figures 4, 5:
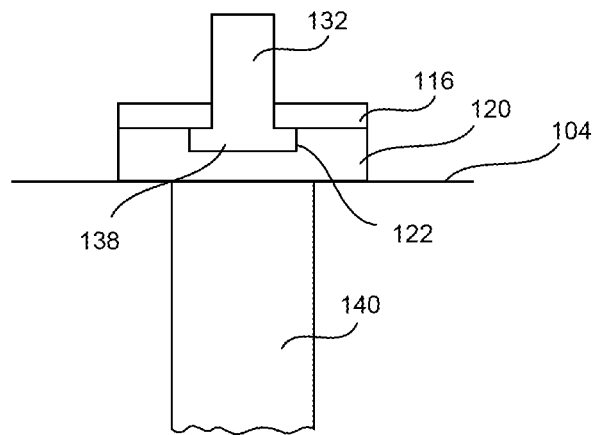
Figures 1, 5:
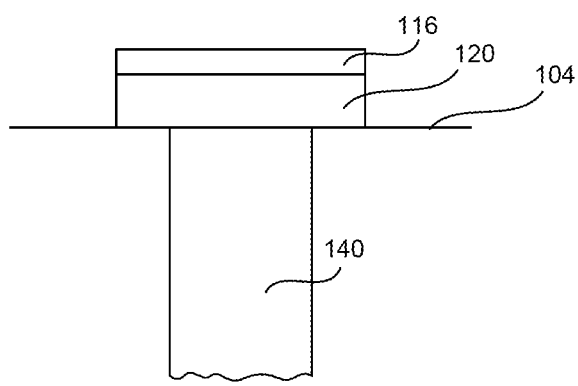
Figures 2, 5:
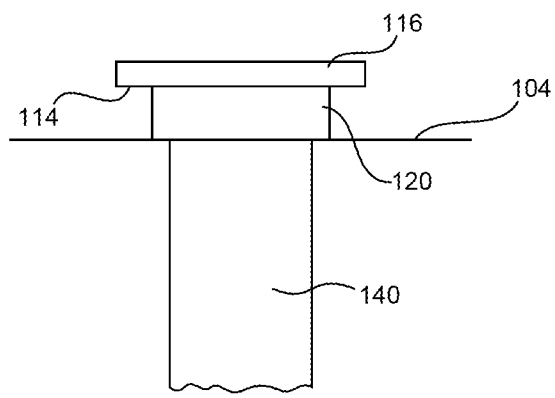
Figures 1, 6:
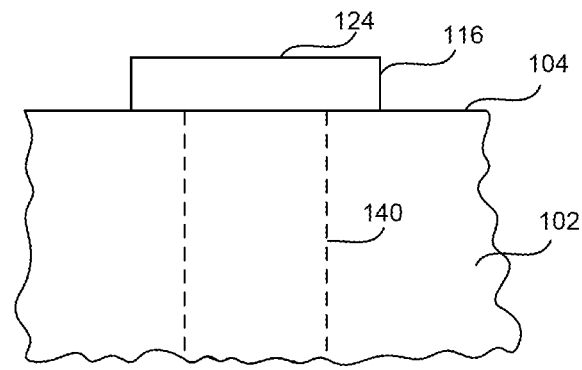
Figures 2, 6:
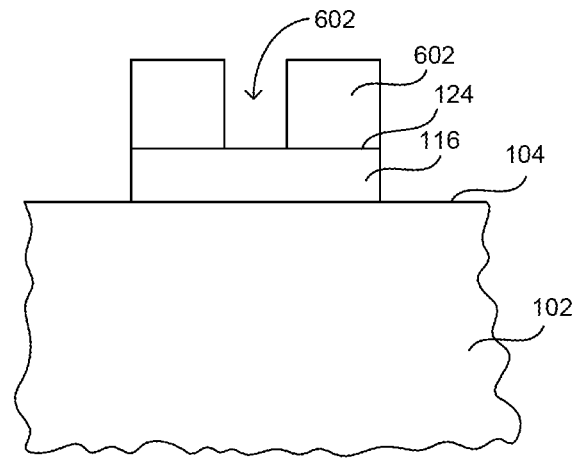
Figures 3, 6:
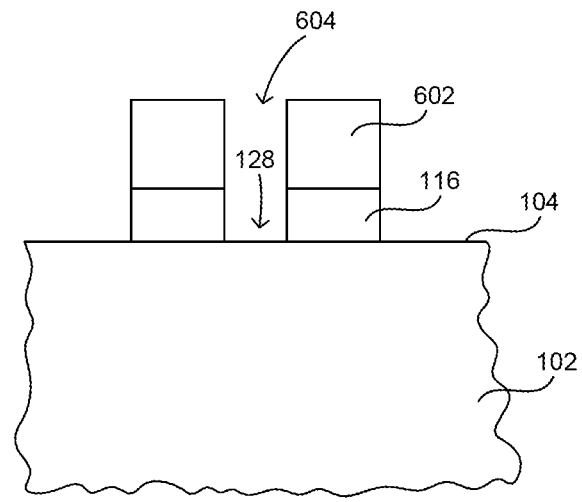
Figures 4, 6:
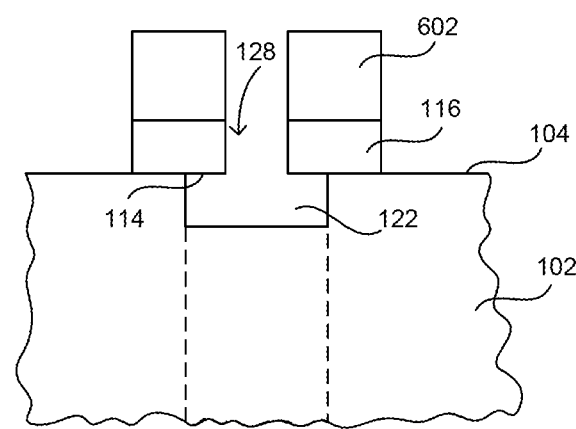
Figures 5, 6:
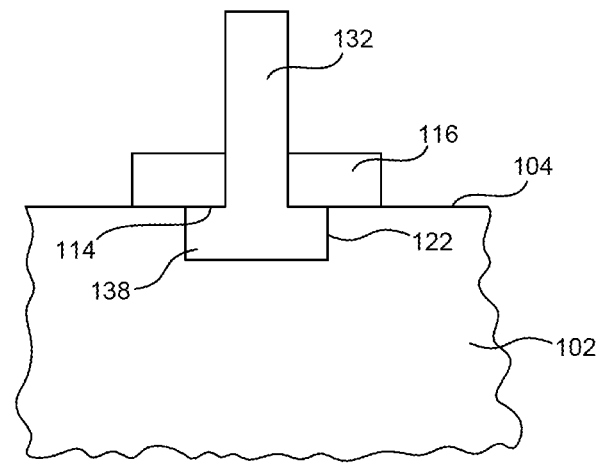
Figures 1, 7:
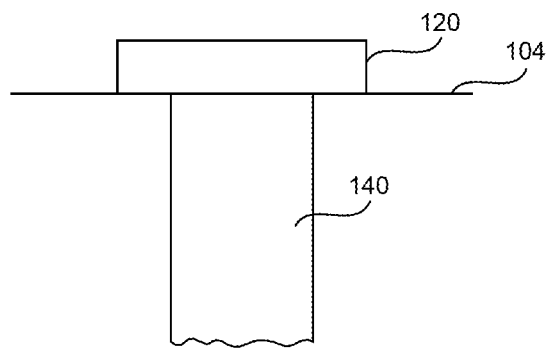
Figures 2, 7:
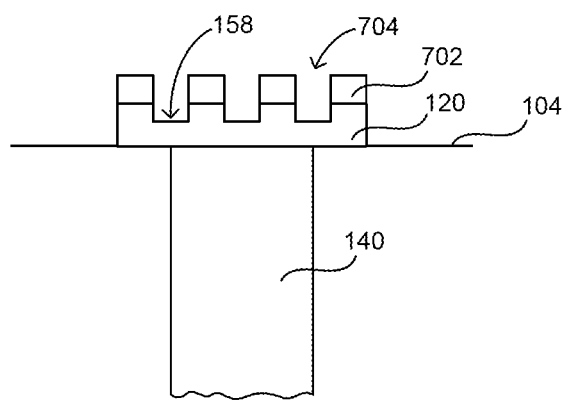
Figures 3, 7:
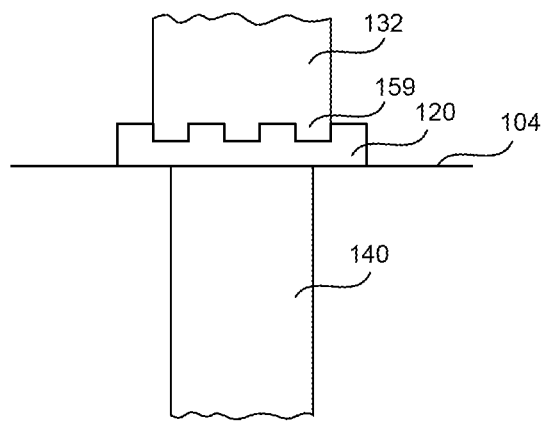

FIGS. 7-1 through 7-2 depict stage in a method of fabricating the anchoring element 156 in accordance with another aspect of the invention. FIG. 7-1 depicts the second metal element 120 deposited overlying the first surface 104 of the support element 102. FIG. 7-2 depicts a patterned photoresist layer 702 deposited overlying the upper surface 121 of the second metal element 120. The patterned photoresist layer 702 includes one or more openings 704 overlying one or more portions of the upper surface 121 of the second metal element 120. Material is removed by processes applied through the openings 704 to form the one or more cavities 158 in the second metal element 120. The photoresist layer 702 can be removed, and the posts 132 can be formed as depicted in FIG. 7-3. Removal of the photoresist layer 702 and formation of the posts 132 can be accomplished by methods discussed above with regards to FIGS. 3-1 through 3-6.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

For example, the order in which particular steps in patterning one or more of metal layers shown to form the first or second metal elements 116, 120 can be varied from the foregoing description. Thus, the processing described above relative to FIGS. 3-1 through 3-6 can be carried out with respect to a continuous metal layer in place of second metal element 120, and can be carried out with respect to a metal layer overlying such layer in place of metal element 116 as depicted in FIG. 3-3. Final patterning to define the extent, i.e, peripheral edges 123 of these elements can be postponed until later stages of the process, such as before or after forming posts 132. Similar variations in the order of patterning metal layers can also be made to the methods described above with respect to FIGS. 4-1 through 4-5, FIGS. 6-1 through 6-5, and FIGS. 7-1 through 7-2.

The invention claimed is:

1. A method of forming a component, comprising:
    forming metal anchoring elements at a first surface of a support element having oppositely facing first and second surfaces, the support element having a thickness extending in a first direction between the first and second surfaces, wherein each anchoring element has an overhang surface, the metal anchoring elements comprising metal elements that are each supported by a structure, each metal element having an upper surface facing away from the first surface and a lower surface remote from the upper surface, wherein a portion of the lower surface, which extends beyond the structure which supports each metal element respectively, defines the overhang surface;
    then forming posts in corresponding openings of a mold overlying the anchoring elements respectively, the posts having first ends proximate the first surface and second ends disposed above the first ends respectively and above the first surface,
    wherein a laterally extending portion of each post contacts at least a first area of the overhang surface of the anchoring element respectively; and
    removing the mold to expose the posts above the first anchoring elements, wherein each said post projects above an exterior surface of the component and is configured for insertion into and electrical connection with a corresponding electrically conductive socket at an exterior surface of a separate second component which surface faces the exterior surface of the component, wherein the component and the separate second component are each one of a microelectronic element, package substrate, interposer or circuit panel, and
    wherein the overhang surface of the anchoring element resists axial and shear forces applied to the posts at positions above the anchoring elements, the axial and shear forces including those caused by removal of the mold.

2. The method of claim 1, wherein the structure is associated with at least a portion of the support element.

3. The method of claim 1, wherein the posts have heights and widths, the height of each said post being 1.5 times the width of each said post respectively.

4. The method of claim 1, wherein the posts include polymer elements having electrically conductive coatings at exterior surfaces thereof.

5. The method of claim 4, wherein forming the posts further comprises:
    injecting polymer materials into the mold overlying the anchoring elements to form the posts.

6. The method of claim 1, wherein the metal element defines an opening and the respective structure at least partially defines a cavity aligned with the opening, and the overhang surface extends beyond a wall of the cavity.

7. The method of claim 1, wherein the overhang surface extends beyond a periphery of the respective structure.

8. The method of claim 1, wherein forming the anchoring elements further comprises:
    forming the metal elements overlying the structures, respectively; and
    undercutting material of the structures to form the overhang surfaces of the metal elements.

9. The method of claim 8, wherein forming the anchoring elements further comprises:
    patterning openings in the metal elements,
    wherein the undercutting of the material of the structures is formed by processing applied through the openings.

10. The method of claim 9, wherein patterning openings in the metal elements further comprises:
    forming photoresist layers overlying portions of upper surfaces of the structures;
    forming the metal elements overlying remaining portions of the upper surfaces of the structures; and
    removing the photoresist layers to expose the openings in the metal elements.

11. The method as claimed in claim 1, further comprising assembling the component with the second component such that the posts are inserted into the corresponding sockets of the second component, thereby electrically coupling the posts with the sockets of the second component.

12. A method of forming a component, comprising:
    forming metal anchoring elements at a first surface of a support element having oppositely facing first and second surfaces, the support element having a thickness extending in a first direction between the first and second surfaces, wherein each anchoring element has one or more recesses extending towards the second surface of the first and second surfaces of the support element, the metal anchoring elements comprising metal elements that are each supported by a structure, each metal element having an upper surface facing away from the first surface and a lower surface remote from the upper surface, wherein a portion of the lower surface extends beyond the structure which supports each metal element respectively;
    then forming posts in corresponding openings of a mold overlying the anchoring elements respectively, the posts having first ends proximate the first surface and second ends disposed above the first ends respectively, and above the first surface, wherein an axially extending portion of each post contacts at least a portion of the one or more recesses of the anchoring element respectively; and removing the mold to expose the posts above the first anchoring elements, wherein each said post projects above an exterior surface of the component and is configured to electrically connect the component with a corresponding electrically conductive element at an exterior surface of a separate second component which faces the exterior surface of the component wherein the component and the separate second component are each one of a microelectronic element, interposer or circuit panel, and wherein the one or more recesses of the anchoring element resists axial and shear forces applied to the posts at positions above the anchoring elements, the axial and shear forces including those caused by removal of the mold.

13. The method as claimed in claim 1, wherein each said post has a height of 50 to 500 microns.

14. The method as claimed in claim 12, wherein each said post has a height of 50 to 500 microns.

15. The method as claimed in claim 12, further comprising assembling the component with the second component such that the posts are inserted into the corresponding sockets of the second component, thereby electrically coupling the posts with the sockets of the second component.

\* \* \* \* \*